(12) United States Patent
Yakobson et al.

(10) Patent No.: US 7,268,074 B2
(45) Date of Patent: Sep. 11, 2007

(54) CAPPING OF METAL INTERCONNECTS IN INTEGRATED CIRCUIT ELECTRONIC DEVICES

(75) Inventors: Eric Yakobson, Irvine, CA (US);
Richard Hurtubise, Clinton, CT (US);
Christian Witt, Woodbridge, CT (US);
Qingyun Chen, Branford, CT (US)

(73) Assignee: Enthone, Inc., West Haven, CT (US)

( * ) Notice: Subject to any disclaimer, the term of this patent is extended or adjusted under 35 U.S.C. 154(b) by 0 days.

(21) Appl. No.: 10/867,346

(22) Filed: Jun. 14, 2004

(65) Prior Publication Data

US 2005/0275100 A1    Dec. 15, 2005

(51) Int. Cl.
*H01L 21/44* (2006.01)
(52) U.S. Cl. .............. 438/653; 438/656; 438/659; 438/672; 438/674
(58) Field of Classification Search ........ 438/653–681, 438/687, 678–680, 629–631
See application file for complete search history.

(56) References Cited

U.S. PATENT DOCUMENTS

| | | | |
|---|---|---|---|
| 4,122,215 A | 10/1978 | Vratny |
| 4,692,349 A | 9/1987 | Georgiou et al. |
| 4,770,899 A | 9/1988 | Zeller |
| 5,169,680 A | 12/1992 | Ting et al. |
| 5,240,497 A | 8/1993 | Shacham et al. |
| 5,380,560 A | 1/1995 | Kaja et al. |
| 5,382,447 A | 1/1995 | Kaja et al. |
| 5,545,927 A | 8/1996 | Farooq et al. |
| 5,549,808 A | 8/1996 | Farooq et al. |
| 5,674,787 A | 10/1997 | Zhao et al. |
| 5,695,810 A | 12/1997 | Dubin et al. |
| 5,705,857 A | 1/1998 | Farooq et al. |
| 5,824,599 A | 10/1998 | Schacham-Diamand et al. |
| 5,846,598 A | 12/1998 | Semkow et al. |
| 5,891,513 A | 4/1999 | Dubin et al. |
| 5,898,222 A | 4/1999 | Farooq et al. |
| 6,060,176 A | 5/2000 | Semkow et al. |
| 6,144,099 A | 11/2000 | Lopatin et al. |
| 6,153,935 A | 11/2000 | Edelstein et al. |
| 6,259,160 B1 | 7/2001 | Lopatin et al. |
| 6,297,146 B1 | 10/2001 | Lopatin |
| 6,323,128 B1 | 11/2001 | Sambucetti et al. |
| 6,358,832 B1 | 3/2002 | Edelstein et al. |
| 6,413,854 B1 | 7/2002 | Uzoh et al. |
| 6,455,425 B1 | 9/2002 | Besser et al. |

(Continued)

FOREIGN PATENT DOCUMENTS

WO    02/101822 A3    12/2002

(Continued)

OTHER PUBLICATIONS

International Search Report, PCT/US2005/020655, dated Oct. 7, 2005.

(Continued)

*Primary Examiner*—Cuong Nguyen
(74) *Attorney, Agent, or Firm*—Senniger Powers

(57) ABSTRACT

A multilayer metal cap over a metal-filled interconnect feature in a dielectric layer for incorporation into a multi-layer integrated circuit device, and a method for forming the cap.

17 Claims, 1 Drawing Sheet

U.S. PATENT DOCUMENTS

| | | |
|---|---|---|
| 6,479,384 B2 * | 11/2002 | Komai et al. ............... 438/687 |
| 6,551,931 B1 | 4/2003 | Edelstein et al. |
| 6,645,567 B2 | 11/2003 | Chebiam et al. |
| 6,646,345 B2 | 11/2003 | Sambucetti et al. |
| 6,680,540 B2 | 1/2004 | Nakano et al. |
| 6,696,758 B2 | 2/2004 | Dubin et al. |
| 6,706,422 B2 | 3/2004 | Inoue et al. |
| 6,709,561 B1 | 3/2004 | Pavlov et al. |
| 6,716,330 B2 | 4/2004 | Hongo et al. |
| 6,717,189 B2 | 4/2004 | Inoue et al. |
| 6,784,088 B2 | 8/2004 | Edelstein et al. |
| 6,787,467 B2 | 9/2004 | Ogure et al. |
| 6,881,437 B2 | 4/2005 | Ivanov et al. |
| 6,924,232 B2 | 8/2005 | Mathew et al. |
| 7,049,234 B2 | 5/2006 | Cheng et al. |
| 2002/0084529 A1 | 7/2002 | Dubin et al. |
| 2002/0123200 A1 | 9/2002 | Yamamoto et al. |
| 2002/0185658 A1 * | 12/2002 | Inoue et al. ............... 257/200 |
| 2003/0072928 A1 | 4/2003 | Edelstein et al. |
| 2003/0116439 A1 | 6/2003 | Seo et al. |
| 2003/0143837 A1 | 7/2003 | Gandikota et al. |
| 2003/0207560 A1 | 11/2003 | Dubin et al. |
| 2004/0235237 A1 | 11/2004 | Inoue et al. |
| 2005/0029662 A1 | 2/2005 | Nakano et al. |
| 2005/0048773 A1 | 3/2005 | Mathew et al. |
| 2005/0101130 A1 | 5/2005 | Lopatin et al. |
| 2005/0266265 A1 | 12/2005 | Cheng et al. |
| 2006/0234508 A1 | 10/2006 | Shirakashi et al. |

FOREIGN PATENT DOCUMENTS

| | | |
|---|---|---|
| WO | WO 03/098676 A1 | 11/2003 |

OTHER PUBLICATIONS

Lopatin, S.D., et al., "Thin Electroless Barrier for Copper Films", *Part of the SPIE Conference on Multilevel Interconnect Technology II*, Sep. 1998, pp. 65-77, vol. 3508, Santa Clara, California.

Hirsch, S., "Immersion Plating", *Metal Finishing, Guidebook and Directory Issue '89*, Jan. 1989, pp. 402-407, vol. 67, No. 1A, Metals and Plastics Publications, Inc., Hackensack, New Jersey.

Itabashi, T., et al., "Electroless Deposited CoWB for Copper Diffusion Barrier Metal", *IEEE*, 2002, pp. 285-287.

Kohn, A., et al., "Characterization of Electroless Deposited Co(W,P) thin lms for Encapsulation of Copper Metallization", *Materials Science and Engineering*, 2001, pp. 18-25, vol. A 302.

Shacham-Diamand, Y., et al., "Electroless Deposition of Thin-Film Cobalt-Tungsten-Phosphorus Layers Using Tungsten Phosphoric Acid ÄH$_3$CPÄW$_3$O$_{10}$Å$_4$ÈÅ for ULSI and MEMS Applications", *Journal of the Electrochemical Society*, 2001, pp. C162-C167, vol. 148, The Electrochemical Society.

* cited by examiner

CAPPING OF METAL INTERCONNECTS IN INTEGRATED CIRCUIT ELECTRONIC DEVICES

BACKGROUND OF THE INVENTION

This invention relates to integrated circuit manufacture and, in particular, to metal-based capping of interconnect metallization.

In damascene processing metallization is employed to form electrical interconnects in an integrated circuit substrate by metal-filling of interconnect features such as vias and trenches formed in the substrate. If the metal deposited on such a substrate is Cu, it can diffuse rapidly into the Si substrate and dielectric films as, for example, $SiO_2$ or low k dielectrics. Copper can also diffuse into a device layer built on top of a substrate in multilayer device applications. Such diffusion can be detrimental to the device because it can cause electrical leakage in substrates, or form an unintended electrical connection between two interconnects resulting in an electrical short. And the corresponding diffusion out of the interconnect feature can disrupt electrical flow therethrough.

Metal deposited on the substrate also has a tendency to migrate out of the interconnect feature when electrical current passes through the feature in service. Electron bombardment of the metal moves the metal out of the feature. This migration can damage an adjacent interconnect line, cause junction leakage, form unintended electrical connections, and disrupt electrical flow in the feature from which the metal migrates.

Accordingly, among the challenges facing integrated circuit device manufacturers is to minimize diffusion and electromigration of metal out of metal-filled interconnect features. This challenge becomes more acute as the devices further miniaturize, and as the features further miniaturize and densify.

Another challenge in the context of metal interconnect features is to protect them from corrosion. Certain interconnect metals, especially Cu, are more susceptible to corrosion.

Copper is a fairly reactive metal which readily oxidizes under ambient conditions. This reactivity can undermine adhesion to dielectrics and thin films, resulting in voids and delamination. Another challenge is therefore to combat oxidation and enhance adhesion between the cap and the Cu, and between structure layers.

To address these challenges the industry has employed a variety of diffusion barrier films as a cap over Cu and other metal interconnect features. Refractory metals and their alloys have been deposited in thin films by physical vapor deposition (PVD). SiN and SiC have been deposited for this purpose by chemical vapor deposition (CVD). A limitation of SiN and SiC is that they have a relatively high dielectric constant (k value), which tends to increase capacitance of the interconnect. An increase in capacitance can increase power dissipation due to resistance/capacitance coupling (RC delay), thereby limiting the performance.

In general, barrier or capping layer formation by blanket vapor deposition is expensive and time-consuming, as it involves multiple processing steps. The deposited films need to be patterned and etched, followed by resist removal. Some degree of misalignment is expected with lithographic patterning.

Electroless Co and Ni have been discussed as a protective layer over electrical interconnect lines in, for example, U.S. patent publication No. 2003/0207560.

Chemical mechanical polishing (CMP) is performed on a substrate prior to capping and following via formation to, for example, remove unwanted Cu overburden deposited during damascene processing and thereby planarize the surface. This CMP can cause traces of copper to be embedded or smeared onto the dielectric material. These traces of copper, if not removed, can contaminate the dielectric. The traces of Cu can have a detrimental effect on the selectivity of a Co-capping process by causing deposition of electroless Co on the dielectric between the Cu traces, which can result in junction leakage. An etchant is therefore employed in a pretreatment composition to either remove these traces of copper, undercut the dielectric on which they reside, or both.

According to conventional wet processing, sequences separate cleaning solutions are employed for cleaning of dielectric, and for cleaning of the metal. Dielectric cleaner lightly etches the dielectric surface in order to undercut metal traces embedded onto the dielectric during CMP. Metal cleaner removes surface oxides on Cu and any remaining traces of Cu embedded in the dielectric that were not removed during the dielectric cleaning step. A cleaner may be necessary to remove residues from Cu inhibitors such as benzotriazole (BTA) compounds used during CMP processing so that such residues do not interfere with effectiveness of activation, uniformity of activation and initiation, smoothness of cap deposition, adhesion of capping deposit, and thermal stability of the cap.

SUMMARY OF THE INVENTION

Briefly, therefore, the invention is directed a method for forming a multilayer metal cap over a metal-filled interconnect feature in an integrated circuit substrate for incorporation into a multilayer integrated circuit device comprising. The method involves depositing a first metal cap layer over the metal-filled interconnect feature in a first deposition process which constitutes electroless metal deposition from an electroless bath comprising a source of metal ions and a reducing agent; and depositing a second metal cap layer over the first metal cap layer in a second deposition process distinct from the first deposition process to thereby form the multilayer metal cap as a permanent component distinct from the metal-filled interconnect feature.

The invention is also directed to a multilayer cap over a metal-filled interconnect feature in an integrated circuit substrate formed by the foregoing method, and to an integrated circuit substrate comprising a multilayer cap over a metal-filled interconnect feature formed by the foregoing method.

DETAILED DESCRIPTION OF PREFERRED EMBODIMENTS

Figure 1:
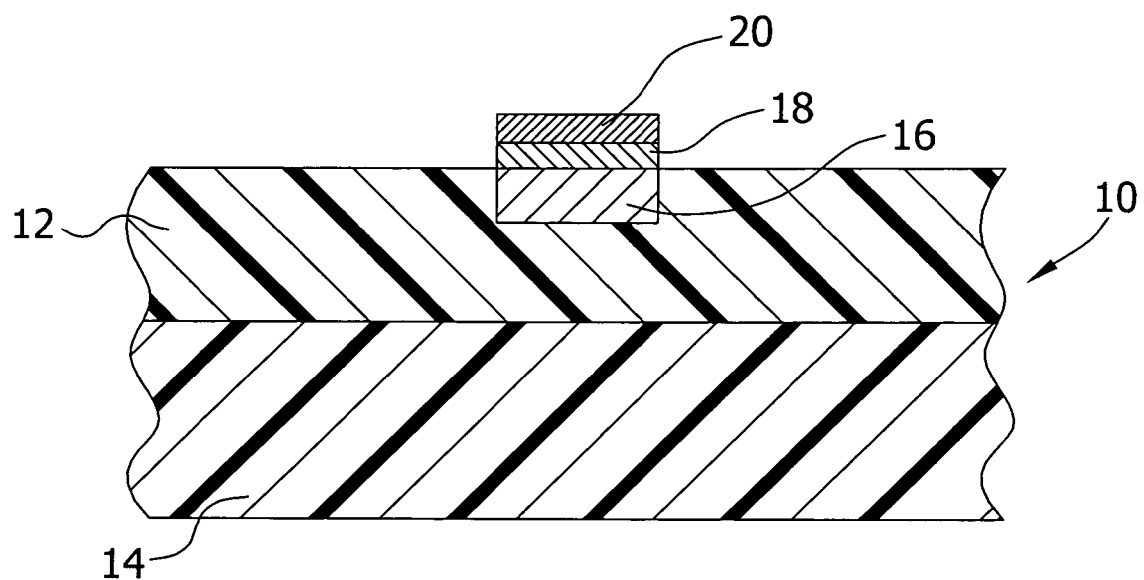
FIG. 1 is a schematic representation of a segment of an integrated circuit device shown in cross-section.

In accordance with this invention, a multilayer metal cap is deposited over an interconnect feature in an electronic device substrate. The substrate is selected from among any substrate which has metal interconnect features, typically Cu, but in some instances Ag, in a dielectric, such as $SiO_2$ and low k dielectrics.

In certain preferred embodiments of the invention, the cap has multiple layers which serve distinct primary purposes, or has multiple distinct layers which function to achieve the same primary purposes. As explained further below, the two or more layers of the cap have different chemistries, and/or are deposited by distinct methods, under distinct conditions, to distinct thicknesses, which renders two or more layers distinct in form.

Depending on various assembly and service conditions, by having such two or more distinct layers, the properties of the cap can be tailored to a particular application; e.g., to be more impervious to electromigration of interconnect metal out of the interconnect, more resistant to corrosion, and/or more resistant to etching during etch-back of subsequently deposited layers of the device. It has been discovered that because the respective two or more layers are distinct from each other in terms of chemistry, microstructure, morphology, and/or other attribute, their combined properties are enhanced in comparison to a single continuous layer of the same overall thickness.

The purpose of the cap is to provide a distinct layer of protection over the interconnect. Accordingly, the metal—which encompasses metal alloys in the context of this invention—is selected for the cap from among effective diffusion and electromigration barrier metals. Such metals are characterized by low diffusivity and low mobility under the manufacturing and service conditions encountered by the device. The cap metals are specifically selected to avoid diffusion into the interconnect, because the goal is to form a distinct cap substantially entirely on top of the interconnect rather than an intermittent reaction layer of intermetallics from the interconnect and cap metals. Specific metals for the first, bottom-most layer of the cap adjacent the interconnect are therefore selected such that they are substantially immiscible with the Cu interconnect. Substantially immiscible means that some insignificant amount of miscibility is tolerated, but the metals are at least sufficiently immiscible that there is no significant reduction in performance due to miscibility under expected service conditions. While suitable immiscibility can be determined by different criteria for different applications within the scope of the invention, in one aspect, the metal is selected from among metals in which Cu has a solubility of less than about $10^4 \times \exp((-0.75 \text{ eV}/kT)$ at. % for a temperature between 900 and 1100° C., and less than about $10^3 \times \exp((-0.52 \text{ eV}/kT)$ at % in the temperature region between 550 and 700° C. The solubility of Cu in bulk Co is $\sim 4.5 \times 10^3 \times \exp((-0.75 \text{ eV}/kT)$ at. % for a temperature between 900 and 1100° C., $\sim 6 \times 10^2 \times \exp((-0.52 \text{ eV}/kT)$ at % in the temperature region between 550 and 700° C. Among metals avoided in the first layer of the cap are Ni, Au, and Ag due to their miscibility with Cu.

The cap metals in all layers are selected to avoid diffusion into the adjacent Si or other substrate material. Suitable diffusivity can be determined by different criteria for different applications within the scope of the invention. Among metals avoided in the second and subsequent layers of the cap are Au and Ag due to their diffusivity and mobility in Si.

As a general proposition, Ni is avoided as a first layer on top of Cu interconnects due to its aforementioned miscibility with Cu and because Ni tends to alter electrical conductivity characteristics of Cu by formation of Ni—Cu intermetallics. Cobalt-based alloys, in contrast, do not significantly alter electrical conductivity characteristics of Cu. One of the several preferred combinations meeting these criteria and described in more detail below involves a Co-based first layer because Co provides good barrier and electromigration protection for Cu.

The cap materials are selected such that they are electrically conducting, rather than insulating. They are also selected so they can be deposited by non-blanket deposition methods, that is, methods which are chemically selective for Cu interconnects, or for previously deposited layers of the multilayer cap.

Within the foregoing material selection criteria, in one aspect the invention is a cap having two or more continuous layers wherein at least one layer is deposited by electroless plating, and the remaining layer or layers are deposited by either electroless plating or an immersion process. In another aspect of the invention one of the layers of the cap is a discontinuous layer formed by an electroless process, and the remaining layer or layers are continuous and deposited by either electroless plating or an immersion process. The multilayer metal cap is not subsequently removed during processing, nor is it annealed to diffuse into the interconnect, and in this regard it is a permanent component distinct from the metal-filled interconnect feature.

As shown schematically and not-to-scale in cross-section in FIG. 1, in one embodiment of the invention there is a component 10 of an eventual multilayer integrated circuit device which includes an insulative material 12 constituting an inter-layer dielectric (ILD) on a semiconductor substrate 14. A typical dielectric material is BD (available from Applied Materials), or low k dielectrics available from Novellus Systems, Inc. of San Jose, Calif. under the trade name Coral. A typical semiconductor substrate is monocrystalline Si. An interconnect feature at the top surface of the feature is filled with Cu metallization 16. The multilayer cap of the invention comprises first metal cap layer 18 and second metal cap layer 20. There is a barrier layer such as TaN in the interconnect between the Cu metallization and the insulative material 12, but this barrier layer is not shown in FIG. 1 to preserve clarity of the schematic.

The invention is further understood by examination of at least five more specific, nonexclusive examples from among the numerous embodiments within the scope of the invention. In a first example of the invention the multilayer cap has a first layer which comprises, e.g., Co—B, Co—B—P, Co—W—B—P, or Co—B—W deposited by borane-chemistry electroless deposition process employing an alkylamine borane compound such as dimethylaminoborane (DMAB), diethylaminoborane (DEAB), or morpholine borane as a reducing agent. These borane-based reducing agents render Cu catalytic to Co deposition. The process is therefore self-initiating on Cu interconnects, so Co, Pd, or other seeding operation is omitted. This is in contrast to electroless processes based on non-borane chemistry, such as employing hypophosphite or other non-borane reducing agents, which do not render Cu catalytic to Co deposition. The non-borane processes, if used to build a layer directly on a Cu interconnect, require Co seeding or other initiation mechanism. In this first embodiment of the invention, this borane-chemistry electroless deposition is performed only to the extent a Co-based layer on the order of about 5 to about 50 angstroms (e.g, about 5 to about 20 angstroms) is formed. In one version of this embodiment this first layer is substantially entirely coalesced to provide coverage which is substantially continuous. In a different version of this embodiment, the first layer is significantly uncoalesced such that its coverage is significantly discontinuous. A second Co-based layer thicker than about 100 angstroms is then deposited by an alternative deposition process, such as by electroless deposition employing a hypophosphite reducing agent, or a mixture of reducing agents. A non-borane process such as an electroless process using a hypophosphite reducing agent is suitable because hypophosphite renders the Co-based first layer catalytic to deposition of a Co-based second layer.

In a second example of the invention, the multilayer cap has a Co-based first layer which is on the order of about 100 angstroms thick or thicker, such as in the range of about 100 to about 300 angstroms, and comprises a composition such as Co—B, Co—B—P, Co—W—B—P, or Co—B—W deposited employing an alkylamine borane such as DMAB, DEAB, or morpholine borane as a reducing agent. A second Co-based layer also of similar thickness greater than 100 angstroms is then deposited by an alternative deposition process, such as by electroless Co deposition employing a hypophosphite reducing agent or mixture of reducing agents.

In a third example of the invention, the multilayer cap has a first layer which is on the order of about 100 angstroms thick or thicker, such as in the range of about 100 to about 300 angstroms, and comprises a composition such as Co—B, Co—B—P, Co—W—B—P, or Co—B—W deposited by self-initiated electroless deposition employing an alkylamine borane such as DMAB, DEAB, or morhpholine borane as a reducing agent. A second Ni-based layer (e.g., Ni—Co) or other non-Co-based layer also of greater than 100 angstroms is then deposited by an alternative deposition process, such as by conventional electroless deposition.

In a fourth example of the invention, the multilayer cap has a first layer which is a Co seed layer. As a seed layer, it is significantly discontinuous and uncoalesced. In the areas where there is coverage, it is especially thin (e.g., 10 angstroms or less). This seed layer may be applied by conventional seeding techniques such as PVD or CVD of a catalytic metal or Co or Ni, or by self-initiated borane-chemistry electroless deposition employing an alkylamine borane reducing agent such as DMAB, DEAB, or morpholine borane as reducing agent. A second layer is on the order of about 100 angstroms thick or thicker, such as in the range of about 100 to about 300 angstroms, and comprises Co-based compositions such as Co—W—P or Co—W—B, and is deposited by electroless deposition. A third layer is a Co-based, Ni-based, or other non-Co-based layer also greater than about 100 angstroms deposited by the same or an alternative deposition process.

In a fifth example of the invention there are two or more adjacent layers deposited using a) the same electroless plating bath under different conditions, or b) different electroless baths under different conditions, or c) different electroless plating baths under the same conditions. Each layer is therefore compositionally modulated by adjustment of one or more deposition parameters. For example, each of two adjacent layers may be deposited using the same bath and identical conditions except that the pH and/or temperature during deposition of the second adjacent layer is different from the pH and/or temperature during deposition of the first layer. Other conditions which can be modulated to affect composition include tool-related effects, such as bath agitation, substrate rotation and rotation speed, solution flow rate, and the like. Or, the pH, temperature, and all the other parameters are the same for each layer, but the compositions are distinct in that the first layer comprises Co—B and a second layer comprises Co—B—W.

These five more specific, nonexclusive examples from among the several embodiments within the invention can therefore be summarized as follows:

Ex I. Layer 1: Co-based layer of low thickness formed by electroless deposition using an alkylamine borane reducing agent
  Layer 2: Co-based layer >100 angstroms formed by electroless deposition process distinct from the process of layer 1

Ex. II Layer 1: Co-based layer >100 angstroms formed by electroless deposition using alkylamine borane reducing agent
  Layer 2: Co-based layer >100 angstroms formed by electroless deposition process distinct from the process of layer 1

Ex. III Layer 1: Co-based layer >100 angstroms formed by electroless deposition using alkylamine borane reducing agent
  Layer 2: Ni-based layer >100 angstroms Ex. IV Layer 1: Co-based seed layer
  Layer 2: Co-based layer >100 angstroms formed by electroless deposition
  Layer 3: Co- or Ni-based electroless layer >100 angstroms Ex. V Layer 1: Co-based layer >100 angstroms formed by electroless deposition
  Layer 2: Co-based layer >100 angstroms formed by electroless deposition Alternatives within the foregoing embodiments are to employ two, three, or more distinct deposition operations such that "multi" of the multilayer cap refers to two, three, or more layers. From a strictly cost and process engineering perspective, it is most typical to employ just two layers, because less operations are involved. However, there may be situations where three, four, or more layers are preferred. For example, three or four layers may be preferred in certain instances when the cap serves several functions. Other alternatives are to replace one of the relatively thicker (100+ angstrom) layers with a layer of moderate thickness, such as between about 60 and about 100 angstroms.

One function performed by the cap of the invention, as noted above, is to serve as a barrier to electromigration of Cu. Ternary Co-based alloys have been discovered to be especially advantageous for this purpose. For many of the preferred embodiments of the invention at least one of the layers employs one of the following alloys:

Co—W—P
Co—W—B
Co—W—B—P
Co—B—P
Co—B
Co—Mo—B
Co—W—Mo—B
Co—W—Mo—B—P
Co—Mo—P

The components of the ternary and more complex alloys for use with the invention include a barrier element, Co, which is selected in significant part because it is immiscible with Cu, and therefore does not tend to alloy with Cu during assembly or over time during service. A second component is the refractory element such as W, Mo, or Re which functions to increase thermal stability, corrosion resistance, and diffusion resistance. A third component is P or B present as a consequence of decomposition of the reducing agent. An effect of these elements is to reduce grain size, which can render the microstructure more impervious to Cu electromigration. COWB with high W content has a phase which appears to approach overall amorphousness. Without being bound to a particular theory, it is believed that the presence of refractory metal together with B and P improves the barrier properties by filling in the grain boundaries of the crystalline structure of the capping film.

One or more of the layers of the cap may comprise a quaternary alloy.

Another function performed by the cap in many of the applications of the invention, as noted above, is to provide an etch stop layer to inhibit damage to interconnects during subsequent etching operations.

Another function which may be performed by the cap is resistance to chemical erosion.

In performing the process of the invention to deposit the cap of the invention as described above, process steps are carried out including preparation of the substrate, self-initiated electroless deposition, surface activation, complexation rinsing, and electroless deposition, as described in more detail below.

In preparing the substrate for capping, one or more acids is employed for mildly etching interlayer dielectric (ILD), and one or more acids is employed for dissolving Cu oxide. Alternatively, alkaline solutions may be preferred for etching certain substrates.

A first pretreatment operation involves exposing the substrate to an acid selected from among HF, $NH_4F$, $H_2SO_4$ for mildly etching the dielectric to remove Cu embedded in the dielectric by CMP. For example, one known HF acid etch for this purpose is a 500:1 buffered hydroflouric (BHF) acid etch.

After the first pretreatment operation is completed, the substrate is rinsed by, e.g., DI water.

A second pretreatment employs an organic or inorganic acid or basic cleaner for removing oxide from the metal interconnect feature. This cleaner preferably removes all the oxide, for example copper oxide, without removing substantial amounts of the metallization in the interconnects. Unless removed, the oxide can interfere with adhesion of the cap and can detract from electrical conductivity. Cleaners of this type are known and typically contain an etching agent such as a weak solution of an acid with less than 10 wt % in water of a strong mineral acid such as HF, $HNO_3$, or $H_2SO_4$ or a weak organic or carboxylic acid such as citric or malonic acid. Such cleaners also include a surfactant to help wet the surface, such as Rhodafac RE620 (Rhone-Poulenc). An alternative acid cleaner contains citric acid and boric acid at pH 6.5.

Typical basic cleaners contain TMAH with addition of hydroxlyamine, MEA, TEA, EDA (ethylenediamine), or DTA (diethylenetriamine) at pH range of 9 to 12.

As a first layer on the metallization, as noted above, certain embodiments of the invention involve deposition of a first Co-based layer by electroless deposition employing borane chemistry. This exposure may comprise dip, flood immersion, spray, or other manner of exposing the substrate to a deposition bath, with the provision that the manner of exposure adequately achieve the objectives of depositing a Co-based cap of the desired thickness and integrity.

For self-initiation of the electroless deposition, the invention employs a borane-based reducing agent such as an alkylamine borane reducing agent, for example DMAB, DEAB, morpholine borane, mixtures thereof, or mixtures thereof with hypophosphite. Oxidation/reduction reactions involving the borane-based reducing agents and Co ions are catalyzed by Cu. In particular, at certain plating conditions, e.g. pH & temperature, the reducing agents are oxidized in the presence of Cu, thereby reducing ionic Co to Co metal which deposits on the Cu. One currently preferred reducing agent system employs about 1 g/L DMAB reducing agent in a mixture with about 10 g/L hypophosphite reducing agent. The process is substantially self-aligning in that the Co is deposited essentially only on the Cu interconnect, such that the process is maskless because there is no need to mask areas other than the interconnect. Moreover, there is no need to subsequently remove substantial amounts of stray Co deposition from the dielectric.

The self-initiating electroless Co deposition bath comprises a source of Co ions which are introduced into the solution as an inorganic Co salt such as chloride and/or sulfate or other suitable inorganic salts, or an inorganic complex such as pyrophosphate, or a Co complex with an organic carboxylic acid such as Co acetate, citrate, lactate, succinate, propionate, hydroxyacetate, EDTA or others in the range of between about 1 and about 20 g/L $Co^{2+}$.

The bath may also contain an alkali-free source of refractory metal ions. The level of refractory metal ions in the deposition bath is between 0 and up to on the order of about 50 g/L of refractory metal salt in the solution. In one embodiment, the refractory metal is selected from among W, Re, Mo, and mixtures thereof.

The bath further contains one or more complexing agents and buffering agents. The complexing agents used in the bath are selected from among citric acid, malic acid, glycine, propionic, succinic, lactic acids, DEA, TEA, and ammonium salts such as ammonium chloride, ammonium sulphate, ammonium hydroxide, pyrophosphate, and mixtures thereof. The buffering agents are selected from among ammonium, borate, phosphate, acetate, and mixtures thereof. For pH adjustment, ammonium, TMAH, or mixtures thereof are typical for alkaline pH adjustment. Sulfuric, hydrochloric, and citric acids are used for acidic pH adjustment, with the acid selection made to correlate to the anion of the Co source.

Within the above guidelines, one electroless bath for self-initiated deposition contains the following constituents, by weight:
$CoCl_2 6H_2O$ 25 g/L
Citric acid 50 g/L
Tungstic acid 4 g/L
DMAB 1 g/L
TMAH ca. 30 g/L of a 25% TMAH solution for pH adjustment
Water Balance
pH 9.5

As an alternative first layer on the metallization, as noted above, certain embodiments of the invention employ an electroless Co-based deposition process which does not employ a reducing agent which renders Cu catalytic to Co deposition. For such processes a surface activation operation is employed to facilitate subsequent electroless deposition. A currently preferred surface activation process utilizes a Pd immersion reaction. Other known hydrogenation/dehydrogenation catalysts for organic synthesis are suitable and include Rh, Ru, Pt, Ir, and Os. Alternatively, the surface may be prepared for electroless deposition by seeding as with, for example, Co seeding deposited by PVD, CVD, or other technique as is known in the art.

Palladium chloride ($PdCl_2$) is a readily available Pd source for the preferred surface activation process. The trend with the present invention is to bias the pH toward milder conditions, such as by buffering the pH to 2 and higher by use of a phosphate or other known buffering agent. It has been discovered that by buffering the pH, excess etching of the Cu interconnects on the substrate is minimized. In buffering, a preferred source of borate is boric acid which is neutralized to tetramethyl ammonium borate in the working solution.

In the surface activation solution a ligand is required to keep the Pd ions in solution. While maintaining Pd in solution, one challenge is not to form too highly complexed of a Pd complex, because the ultimate goal is to have the Pd release and deposit onto the Cu in reasonable deposition times, such as about 30 seconds or less. Bromide is one preferred ligand in the activation process of the invention. Bromide may be provided by HBr. It has been discovered that bromide between about 50 ppm and about several grams/L allows use of lower $PdCl_2$ (e.g., 10 ppm) concentration because bromide-Pd complexes are not too strong and not too weak. Bromide-Pd complexes are therefore not so strong that they do not readily release for deposition onto the substrate, yet they are not so weak that they release too readily such that selectivity is lost. With bromide-Pd complexes, therefore, selectivity is enhanced, which provides an added benefit that the amount of Pd in the solution can be lower than if other complexes are employed. Such bromide levels achieve acceptable Pd deposition initiation rates of less than about 30 seconds. In particular, at 10 ppm Pd, 120 ppm bromide, and a pH of 4, acceptable initiation rates are achieved with no appreciable Cu etch.

Sources of $Pd^{2+}$ other than $PdCl_2$ include $PdSO_4$, $PdBr_2$, $Pd(NO_3)_2$, palladium acetate, and palladium propionate. The complexing ligand for stabilizing the $Pd^{2+}$ is citrate, acetic acid, or MSA. An acid or mixture of acids correlating to the anion of the Pd compound such as the exemplary inorganic acids hydrochloric, hydrobromic, sulfuric, and phosphoric is used for pH adjustment. Less aggressive acids are preferred in many instances to alleviate problems of microtrenching at the interface between Cu and Ta or other barrier on the dielectric. Such acids are optionally organic acids such as organic aliphatic mono- & di-carboxylic acids (glycolic, succinic, oxalic, lactic, trifluoroacetic (halogen-substituted)), aromatic mono- & di-carboxylic acids (benzoic, phtalic), aromatic sulfonic or sulfinic (benzenesulfonic, toluenesulfonic, cumenesulfonic, xylenesulfonic, phenolsulfonic, cresolsulfonic, naphtalenesulfonic, and analogous-sulfinics), aromatic phosphonic or phosphinic, or inorganic Acids with reducing properties (hypophosphorous, sulfurous). Palladium sources are typically, but not necessarily, selected to have an anion correlating to such acids not necessarily.

A second challenge in formulating activation chemistry is selectivity of deposition for the metal over the dielectric, to avoid forming activation sites on the dielectric surface. This challenge is addressed by combination of pre-cleaning, Pd activation chemistry, and post activation cleaning/complexing rinse as described herein.

The process is substantially self-aligning in that the activator is deposited essentially only on the Cu interconnect, such that the process is maskless because there is no need to mask areas other than the interconnect.

A surfactant such as Calsoft LAS99 can optionally be used to improve wetting.

After activation, the substrate is exposed to a complexing rinse, which functions to remove residual ionic activator left behind by the activator composition, and thereby minimize subsequent deposition on unintended surfaces.

The invention in several aspects also involves electroless deposition which employs reducing agents other than the borane-based reducing agents described above. In particular, such deposition is one of the options used when forming a) a first layer, provided the Cu substrate is either activated or seeded as described above, b) a second layer on top of a Co-based first layer, or c) a third or subsequent layer on top of a second or subsequent layer. In aspect (a), the invention employs an electroless metal deposition layer deposited with the assistance of a reducing agent which i) renders a metal seed on the Cu catalytic to deposition, or ii) assists with Pd-catalyzed deposition of an activated Cu substrate. In aspect (b), the invention employs an electroless Co and/or Ni and/or other metal deposition layer deposited with the assistance of a reducing agent which renders the previously applied Co-based layer catalytic to deposition of the next layer. To achieve this, for example, an electroless bath is employed comprising a source of Co ions and a reducer. The Co ions are introduced into the solution as an inorganic Co salt such as chloride and/or sulfate or a Co complex with an organic carboxylic acid such as Co acetate, citrate, lactate, succinate, propionate, or hydroxyacetate in the range of between about 2 and about 50 g/L Co.

One or more reducing agents such as a hypophosphite reducing agent (e.g., ammonium hypophosphite) is employed in a concentration roughly between about 2 and about 30 g/L. The reducing agent is alkali-free; and particularly Na-free. Other reducing agents are described in Mallory and Hajdu (Eds.), *Electroless Plating, Fundamentals and Applications*, American Electroplaters and Surface Finishers Society (1990), as well as numerous electroless bath compositions and reaction chemistries for Ni and Co electroless plating. In one embodiment a hypophosphite or other reducing agent is supplemented with a borane-based reducing agent.

The bath further may also contain an alkali-free source of refractory metal ions. The level of refractory metal ions in the deposition bath in a concentration between 0 and up to on the order of about 50 g/L refractory metal salt. In one embodiment, the refractory metal is selected from among W, Re, Mo, and mixtures thereof.

In one especially preferred embodiment, W ions are provided by an alkali-free, tungstate-based source of W ions. Preferred among such sources of W ions are tetramethylammonium tungstate, phosphotungstate, silicotungstate, and mixtures thereof. For example, one preferred deposition bath contains between about 2 and about 10 g/L tungstic acid neutralized by TMAH. Other sources of refractory metal include ammonium molybdate.

A stabilizer for the Co is incorporated into one preferred embodiment of the electroless Co deposition bath. Though the Co complexes are stable in solution in the absence of a reducing agent, the use of a stabilizer can help prevent spontaneous decomposition of the bath components. Exemplary stabilizers include, for example, Pb, Bi, Sn, Sb, $IO_3$, $MoO_3$, $AsO_3$ azoles such as imidazole and derivatives. The stabilizer level is on the order of between about 0.1 and about 100 ppm. For example, for $Pb^{+2}$ from about 5 to about 20 ppm has been shown to be effective. For $MoO_4^{-2}$, about 10 to about 100 ppm has been shown to be effective. One preferred stabilizer is maleic acid, which is a stabilizer within the four classes discussed in Mallory and Hajdu (Eds.), *Electroless Plating, Fundamentals and Applications*, American Electroplaters and Surface Finishers Society (1990) (p. 34–44).

A grain refiner for the deposited Co is optionally incorporated into the bath. This grain refiner can also be characterized as a stabilizer, but this grain refiner is distinguished from the stabilizers described above in that those stabilizers do not primarily perform a grain refining function. Exemplary grain refiners include, for example, Cd, Cu, Al, saccharine, 2-butyne-1,4,-diol and its alkoxylates, 3-hexyne-2, 5,-diol, propargyl alcohol and its alkoxylates and sulfonates, alyl sulfonate, betaine and its sulfobetaine derivatives.

The bath typically contains a pH buffer to stabilize the pH in the desired range. In one embodiment, the desired pH range is between about 8.0 and about 10.0. If the pH is not stabilized, unintentional, undesirable, and unanticipated changes in deposition rate and deposit chemistry can occur. Exemplary buffers include, for example, borates, tetra- and pentaborates, phosphates, acetates, glycolates, lactates, ammonia, and pyrophosphate. The pH buffer level is on the order of between about 10 and about 50 g/L.

A complexing agent for the Co is included in the bath to help keep the Co in solution. The bath is typically operated at a pH of between about 8 and about 10, at which level the Co can have a tendency to form hydroxides and precipitate out of solution. Exemplary complexing agents include citrate, glycolic acid, lactic acid, malic acid, succinic acid, pyophosphate, ammonium, DEA, TEA, and EDTA. The complexing agent concentration is selected such that the molar ratio between the complexing agent and Co is between about 2:1 and about 4:1, generally. Depending on the complexing agent molecular weight, the level of complexing agent may be on the order of between about 20 g/L and about 120 g/L.

One or more surfactants is optionally included in the bath to help wet the substrate surface. The surfactant also can serve as a mild deposition inhibitor which can suppress three-dimensional growth to an extent, thereby improving morphology and topography of the film. It can also help refine the grain size, which yields a more uniform coating which has grain boundaries which are less porous to migration of Cu. Exemplary anionic surfactants include alkyl phosphonates, alkyl ether phosphates, alkyl sulfates, alkyl ether sulfates, alkyl sulfonates, alkyl ether sulfonates, carboxylic acid ethers, carboxylic acid esters, alkyl aryl sulfonates, and sulfosuccinates. Exemplary non-ionic surfactants include alkoxylated alcohols, ethoxy/propoxy (EO/PO) block copolymers, alkoxylated fatty acids, glycol and glycerol esters, with polyethylene glycols, and polypropylene glycol/polyethylene glycol currently preferred. The level of surfactant is on the order of between about 0.01 and about 5 g/L.

Within the above guidelines, one electroless bath for deposition as disclosed in Shacham-Diamand, Journal of Electrochemical Society "Electroless Deposition of Thin-Film Co—W—P Layers" (2001) contains the following constituents:

| | |
|---|---|
| 23 g/L | $CoSO_4$—$H_2O$ |
| 21 g/L | $NaH_2PO_2$ |
| 130 g/L | Na citrate |
| 10 g/L | $Na_2WO_4$—$H_2O$ |
| 0.05 g/L | Rhodafac RE-610 |
| Balance | water |
| pH about 9.0 | |

Another suitable bath disclosed therein contains the following:

| | |
|---|---|
| 23 g/L | $CoSO_4$—$H_2O$ |
| 21 g/L | $NaH_2PO_2$ |
| 130 g/L | Na citrate |
| 10 g/L | $H_3P(W_3O_{10})_4$ |
| 0.05 g/L | Rhodafac RE-610 |
| Balance | water |
| pH about 9.0 | |

A further suitable bath is disclosed in U.S. Pat. No. 5,695,810:

| | |
|---|---|
| 10 g/L | $(NH_4)_2WO_4$ |
| 30 g/L | $CoCl_2$—$6H_2O$ |
| 80 g/L | $Na_3C_6H_4O_7$—$2H_2O$ |
| 20 g/L | $Na_2H_2PO_2$ |
| 0.05 g/L | Rhodafac RE610 |

This electroless process, like the above-described process employing a borane-based reducing agent, is substantially self-aligning in that the electroless metal is deposited essentially only onto the metal interconnect, or onto a previously deposited metal cap layer in the situation of a second or subsequent layer in multilayer deposition. The process therefore does not require lithography and its several steps of patterning, stripping etc. Moreover, there is no need to subsequently remove substantial amounts of unintended cap metal deposition from the dielectric.

While the emphasis in the above-described preferred embodiments is on electroless deposition processes, one or more of the layers of the multilayer cap may alternatively be applied by a metal immersion process as is known in the art. In immersion plating, also known as displacement plating, a metal on a surface is displaced by a metal ion in an immersion reaction. The driving force is a lower oxidation potential of the metal ion in the solution. Immersion plating parameters are disclosed in Hirsch et al., "Immersion Plating," Metal Finishing Guidebook, 1989, pp. 402–406. In immersion plating, the base metal on the surface functions as the reducing agent. Immersion plating therefore differs from electroless plating in that a further reducing agent is not required. Another distinction is that, in theory, in immersion plating the plating stops once the surface is covered with the metal being deposited. In this regard it is self-limiting. In contrast, electroless plating is auto-catalytic and, in theory, it continues as long as there is ample reducing agent in the solution.

In performing the invention to produce a multilayer cap and integrated circuit substrate of the invention, the substrate is a dielectric material in which one or more, typically many, interconnect features have been formed. In depositing the multilayer cap on a metal-filled interconnect feature, the cap is built up on top of the interconnect feature and, dimensionally, forms an extension comprising layers 18 and 20 (FIG. 1) on the top of the interconnect feature. Accordingly, the interconnect/cap combination is dimensionally larger than the interconnect prior to capping.

The exposed surface of an interconnect feature prior to capping is typically roughly co-planar with a flat top surface of the dielectric material. This co-planarity is achieved by CMP to remove metal—metal typically applied over the entire dielectric and into interconnect features by a previous electrodeposition operation—from the top surface of the dielectric. The only metal left on the substrate after the CMP operation is the exposed metal in the interconnect features, plus perhaps some trace metal embedded into the dielectric by the CMP, though this trace metal is typically removed by an above-described cleaning operation. In instances where an interconnect feature prior to capping is co-planar with a flat top surface of the dielectric material, the multilayer cap applied by this invention extends above the plane defined by the flat top surface of the dielectric material with which the exposed surface of the interconnect feature is co-planar. Depositing the cap in these instances therefore involves building cap material on top of the metal interconnect such that the cap extends above the plane of the dielectric.

The multilayer cap, which dimensionally constitutes an extension on top of the wiring, is permanent in that it is not removed in subsequent processing. For example, in forming multilayer devices, an etch stop layer is typically applied over the entire top surface of the dielectric and any cap extensions covering interconnects. In the present invention, this is performed without any intermittent chemical, mechanical, or other operation to remove the cap extensions. Most typically, the etch stop layer is applied directly over the top surface of the dielectric and directly over any cap extensions covering interconnects. This is also accomplished without an intermittent annealing operation because the Co-based cap serves its protective capping function without such an anneal.

Multiple layers of dielectric and circuitry are then built by conventional means. The eventual multilayer integrated circuit device may be incorporated into an electronic package by way of an external electrical connector, such as a wire bond structure. The device comprises a series of dielectric layers between which are metal interconnects with caps thereon. The multilayer cap of the invention is a barrier on top of Cu interconnects embedded in dielectric.

In view of the above, it will be seen that the several objects of the invention are achieved and other advantageous results attained.

When introducing elements of the present invention or the preferred embodiment(s) thereof, the articles "a", "an", "the" and "said" are intended to mean that there are one or more of the elements. For example, that the foregoing description and following claims refer to "an" interconnect means that there are one or more such interconnects. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method for forming a multilayer metal cap over a metal-filled interconnect feature in a dielectric layer for incorporation into a multilayer integrated circuit device comprising:
   depositing a first metal cap layer having a thickness between about 100 and about 300 angstroms over the metal-filled interconnect feature in a first deposition process which constitutes electroless metal deposition from a first electroless solution comprising a source of Co ions and a reducing agent;
   depositing a second metal cap layer over the first metal cap layer in a second deposition process which constitutes electroless metal deposition from a second electroless solution which comprises a source of Ni ions and a reducing agent to thereby form the multilayer metal cap as a permanent component distinct from the metal-filled interconnect feature.

2. The method of claim 1 wherein the first electroless solution comprises the source of Co ions and a borane-based reducing agent.

3. The method of claim 1 wherein the first deposition process is self-aligning in that the first metal cap layer is selectively deposited onto the metal-filled interconnect and the second deposition process is self-aligning in that the second metal cap layer is selectively deposited onto the first metal cap layer.

4. The method of claim 1 wherein the metal-filled interconnect feature is a Cu-filled interconnect feature, and the first metal cap layer comprises a metal or metal alloy which is substantially immiscible with Cu.

5. The method of claim 1 comprising discontinuing deposition between the first deposition process and the second deposition process.

6. The method of claim 1 wherein the first metal cap layer comprises a Co-based alloy and the second metal cap layer comprises a Ni-based alloy.

7. The method of claim 1 wherein:
   the metal-filled interconnect feature is a Cu-filled interconnect feature;
   the second deposition process is an electroless deposition process which is self-aligning in that the second metal cap layer is selectively deposited on the first metal cap layer;
   the first deposition process is self-aligning in that the second metal cap layer is selectively deposited on the first metal cap layer; and
   the first deposition process is distinct from the second deposition process in that the first deposition process employs a first electroless solution which has a first solution composition distinct from, and prepared separately from, a second electroless solution having a second solution composition employed in the second deposition process.

8. The method of claim 1 wherein:
   the metal-filled interconnect feature is a Cu-filled interconnect feature;
   the second deposition process is an electroless deposition process;
   the first deposition process is distinct from the second deposition process in that the first deposition process employs a first electroless solution which has a first solution composition distinct from, and prepared separately from, a second electroless solution having a second solution composition employed in the second deposition process;
   the second metal cap layer has a thickness greater than about 100 angstroms; and
   the first metal cap layer having a thickness between about 100 and about 300 angstroms comprises a Co-based alloy.

9. The method of claim 1 wherein:
   the metal-filled interconnect feature is a Cu-filled interconnect feature;
   the second deposition process is an electroless deposition process;
   the first deposition process is distinct from the second deposition process in that the first deposition process employs a first electroless solution which has a first solution composition distinct from, and prepared separately from, a second electroless solution having a second solution composition employed in the second deposition process;
   the second metal cap layer comprises a Ni-based alloy and has a thickness greater than about 100 angstroms; and
   the first metal cap layer having a thickness between about 100 and about 300 angstroms comprises a Co-based alloy.

10. The method of claim 8 wherein said Co-based alloy is Co-B.

11. The method of claim 8 wherein said Co-based alloy is Co-B-P.

12. The method of claim 8 wherein said Co-based alloy is Co-W-B-P.

13. The method of claim 8 wherein said Co-based alloy is Co-B-W.

14. The method of claim 9 wherein said Co-based alloy is Co-B.

15. The method of claim 9 wherein said Co-based alloy is Co-B-P.

16. The method of claim 9 wherein said Co-based alloy is Co-W-B-P.

17. The method of claim 9 wherein said Co-based alloy is Co-B-W.

* * * * *